(12) United States Patent
Trivedi

(10) Patent No.: US 11,875,865 B2
(45) Date of Patent: Jan. 16, 2024

(54) SELECT GATE RELIABILITY

(71) Applicant: Micron Technology, Inc., Boise, ID (US)

(72) Inventor: Falgun G. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 17/670,111

(22) Filed: Feb. 11, 2022

(65) Prior Publication Data
US 2023/0207029 A1 Jun. 29, 2023

Related U.S. Application Data

(60) Provisional application No. 63/294,706, filed on Dec. 29, 2021.

(51) Int. Cl.
*G11C 11/34* (2006.01)
*G11C 16/34* (2006.01)
*G11C 16/26* (2006.01)
*G11C 16/10* (2006.01)

(52) U.S. Cl.
CPC ........ *G11C 16/3495* (2013.01); *G11C 16/102* (2013.01); *G11C 16/26* (2013.01); *G11C 16/3404* (2013.01)

(58) Field of Classification Search
CPC ... G11C 16/3495; G11C 16/102; G11C 16/20; G11C 16/3404
USPC .................................................. 365/185.22
See application file for complete search history.

(56) References Cited

U.S. PATENT DOCUMENTS

| | | | | |
|---|---|---|---|---|
| 6,925,009 B2 * | 8/2005 | Noguchi | ................ | H10B 69/00 365/185.11 |
| 7,746,707 B2 * | 6/2010 | Tanaka | ................ | G11C 11/5635 365/185.24 |
| 8,223,558 B2 * | 7/2012 | Tanaka | ................. | G11C 16/345 365/185.21 |

(Continued)

FOREIGN PATENT DOCUMENTS

| CN | 116364159 A | * | 6/2023 | ........... G11C 16/102 |
|---|---|---|---|---|
| WO | 2017074570 A1 | | 5/2017 | |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Viet Q Nguyen
(74) *Attorney, Agent, or Firm* — Brooks, Cameron & Huebsch, PLLC

(57) ABSTRACT

A method includes determining a programmed threshold voltage for a select gate of a memory string and assigning the select gate a programmed reliability rank based upon the programmed threshold voltage. The programmed reliability rank indicates that hot data, warm data, and/or or cold data are programmable to the memory string. The method further includes incrementing a quality characteristic count to a first check voltage value, determining a first checked threshold voltage for the select gate at the first check voltage value, and assigning the select gate a first reliability rank based upon the first checked threshold voltage. The first reliability rank indicates that the warm data or the cold data, or both, are programmable to the memory string.

20 Claims, 5 Drawing Sheets

(56) References Cited

U.S. PATENT DOCUMENTS

| | | | |
|---|---|---|---|
| 10,147,488 B2* | 12/2018 | Hisamoto | G11C 16/16 |
| 10,755,786 B2* | 8/2020 | Shimura | G11C 16/3459 |
| 10,784,275 B1* | 9/2020 | Maejima | G11C 5/06 |
| 11,423,990 B2* | 8/2022 | Koushan | G11C 16/14 |
| 2014/0231954 A1 | 8/2014 | Lue | |
| 2016/0179386 A1 | 6/2016 | Zhang | |

* cited by examiner

SELECT GATE RELIABILITY

TECHNICAL FIELD

Embodiments of the disclosure relate generally to memory sub-systems, and more specifically, relate to select gate reliability.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
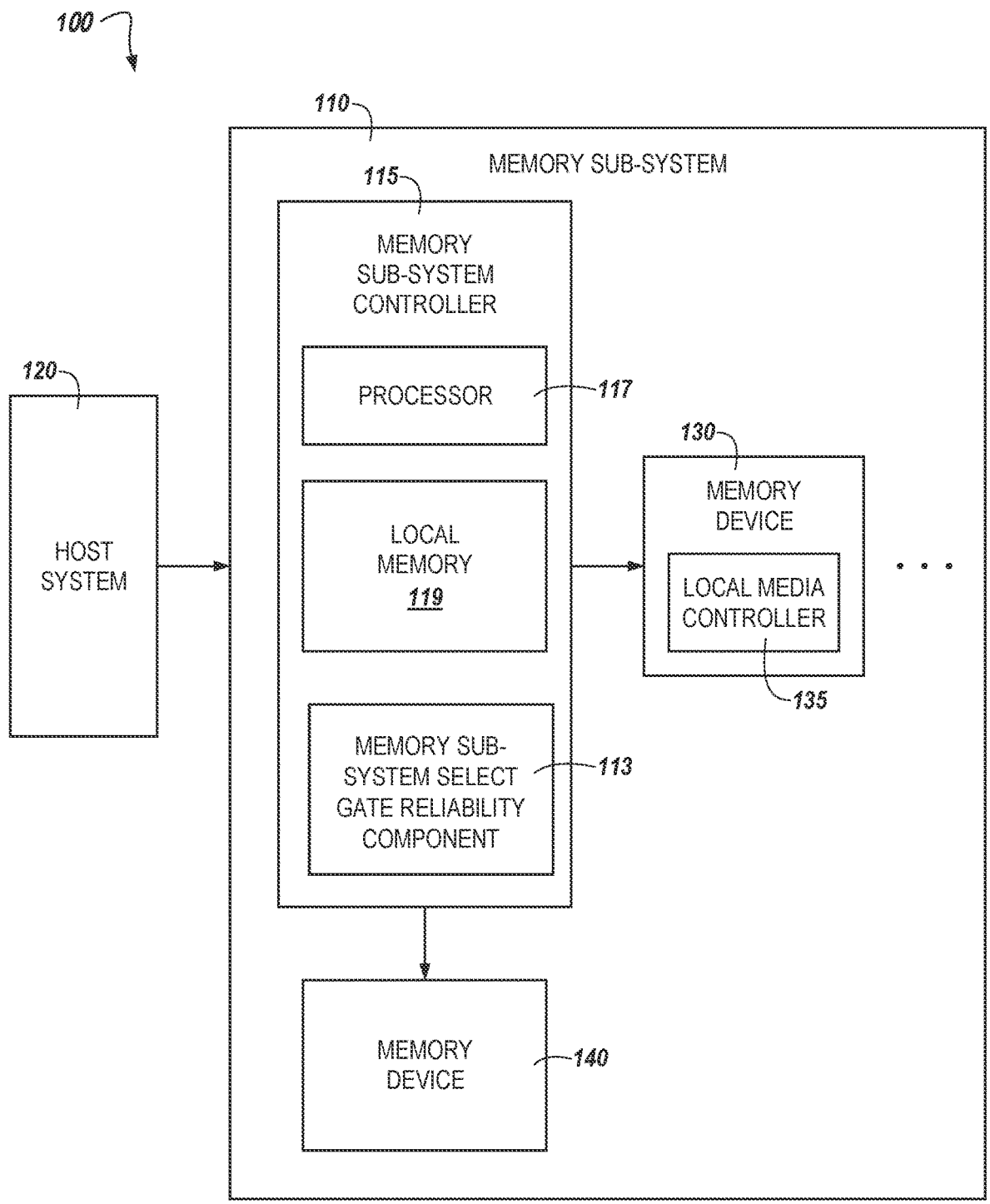
FIG. 1 illustrates an example computing system that includes a memory sub-system in accordance with some embodiments of the present disclosure.

Aspects of the present disclosure are directed to select gate reliability in a memory sub-system, in particular to memory sub-systems that include memory strings, where each memory string includes multiple select gates. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data (e.g., memory objects). The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates, while floating-gate architectures generally do not allow for the select gates to be programmed. Embodiments provide that the select gates are programmable, and therefor can be deployed in a replacement-gate memory architecture.

Because the select gates of replacement-gate NAND architectures can be programmed (e.g., can be biased to a logic HIGH or logic LOW state, or states in between), such select gates can be susceptible to shifting or "drifting" of the voltage corresponding to the state programmed to the select gates. For example, the threshold voltage (VT) distribution of the select gates of replacement-gate NAND architectures can shift or "drift," due to physical degradation from a quantity of program-erase cycles (PEC) and/or a quantity of sense operations performed by a memory string associated with the select gates. That is, the VT of the select gates of replacement-gate architectures can change over time such that the actual VT distribution corresponding to the select gates is different than the expected VT distribution corresponding to the select gates. The physical degradation can result in charge loss or charge gain over time (e.g., over the lifetime of a NAND device that employs a replacement-gate architecture) by the select gates.

Some approaches attempt to mitigate the effects of charge loss, charge gain, and/or other voltage drift phenomenon experienced by programmable select gates over time by periodically performing a select gate scan operation in which the VT distribution of the select gates is reset to the expected VT distribution. However, such approaches perform such select gate scan operations on all of the select gates of an entire memory die or of all the memory dice of a memory device or memory sub-system without regard for characteristics of the memory dice. While such approaches can correct the effects of charge loss, charge gain, and/or other voltage drift phenomenon experienced by programmable select gates over time, these approaches can fail to account for adverse effects of process variation in memory dice of a memory device or memory sub-system, as well as failing to account for degradation of the memory dice due to program-erase cycles experienced by memory cells of the memory dice due to workloads allocated to the memory dice. By failing to account for these and other real-life characteristics of memory dice, such approaches can lead to the need for deep error recovery flows to be invoked in order to correct the effects of charge loss, charge gain, and/or other voltage drift phenomenon experienced by programmable select gates over time, which can give rise to an increase in latency experienced by the memory device and/or memory sub-system and therefore a decrease in quality of service (QoS) provided by the memory device and/or memory sub-system.

Aspects of the present disclosure address the above and other deficiencies by assigning a select gate reliability rank, based upon threshold voltage values, for the respective select gates of respective memory strings. These select gate ranks can be utilized to determine which type of data are programmable to respective memory strings. This can provide an improved end of life reliability (e.g., by slowing down physical degradation on the select gates) and reduce degradation related failures. The select gate reliability rank(s) can be represented by flags, bit patterns, and/or markers, among other indicators that can be written to stored by, and/or monitored by a memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a select gate reliability component 113. Although not shown in FIG. 1 so as to not obfuscate the drawings, the select gate reliability component 113 can include various circuitry to facilitate performance of select gate reliability operations. As described in more detail, herein, the select gate reliability operations can be performed on the respective select gates of respective memory strings of the memory sub-system 110. By performing select gate reliability operations, an improved end of life reliability and reduction of degradation related failures for the memory sub-system 110 can be achieved. In some embodiments, the select gate reliability component 113 can include special purpose circuitry in the form of an ASIC, FPGA, state machine, and/or other logic circuitry that can allow the select gate reliability component 113 to orchestrate and/or perform operations described herein involving the memory device 130 and/or the memory device 140.

In some embodiments, the memory sub-system controller 115 includes at least a portion of the select gate reliability component 113. For example, the memory sub-system controller 115 can include a processor 117 (processing device) configured to execute instructions stored in local memory 119 for performing the operations described herein. In some embodiments, the select gate reliability component 113 is part of the host system 110, an application, or an operating system.

In some embodiments, the memory sub-system 110, and hence the select gate reliability component 113, the processor 119, and the memory devices 130/140, can be resident on a mobile computing device such as a smartphone, laptop, or phablet among other similar computing devices. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally).

Examples of "mobile computing devices" are not so limited, however, and in some embodiments, a "mobile computing device" can refer to an IoT device or any other type of edge computing device(s).

Further, the select gate reliability component 113 can be resident on the memory sub-system 110. As used herein, the term "resident on" refers to something that is physically located on a particular component. For example, the select gate reliability component 113 being "resident on" the memory sub-system 110 refers to a condition in which the hardware circuitry that comprises the select gate reliability component 113 is physically located on the memory sub-system 110. The term "resident on" can be used interchangeably with other terms such as "deployed on" or "located on," herein.

Figure 2:
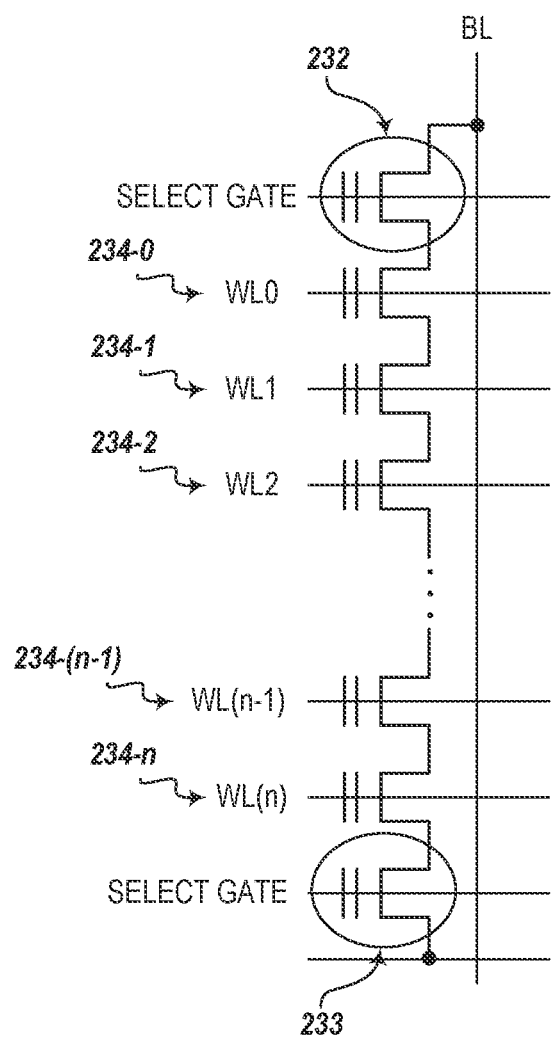
FIG. 2 illustrates an example of a memory string that includes select gates in accordance with some embodiments of the present disclosure.

FIG. 2 illustrates an example of a memory string 231 that includes select gates 232, 233 in accordance with some embodiments of the present disclosure. In a NAND architecture memory device, the memory blocks can be organized as strings of memory cells, such as memory string 231 illustrated in FIG. 2. Each respective memory string can be comprised of a number of flash memory cells coupled to word lines 234-0 to 234-n coupled serially drain-to-source between respective select gates 232, 233 (e.g., transistors). The select gates 232, 233 can represent multiple select gates and/or multiple drains and/or sources of multiple select gates, as described in more detail herein. Embodiments provide that n may have different values for various applications. Memory devices may include different numbers of memory strings 231 for various applications.

The select gate drain (SGD) 232 and a select gate source (SGS) 233, which are connected in series, can be utilized to turn on the memory string 231 to perform operations, such as programming or reading the memory cells couped to the word lines 234-0 to 234-n. Embodiments of the present disclosure provide that the select gates 232, 233 are processed (e.g., fabricated) as the memory cells that are coupled to the word lines 234-0 to 234-n are processed. In other words, the select gates 232, 233 are the same type of cell as the memory cells coupled to the word lines 234-0 to 234-n. For instance, the select gates 232, 233 are formed of the same type of transistors as NAND flash memory cells coupled to the word lines 234-0 to 234-n. Although only one select gate(s) 232, 234 of FIG. 2 are illustrated, it is contemplated within the scope of the disclosure that the memory string 231 can be coupled to multiple select gates, each of which can include a respective SGD and SGS.

Since the select gates 232, 233 initially behave the same as the memory cells that are coupled to the word lines 234-0 to 234-n, the select gates 232, 233 can be programmed and erased as well. Thus, prior to initial use of the memory device, the select gates 232, 233 can be programmed to a particular programmed threshold voltage (e.g., an initial threshold voltage) to enable proper operation of each memory string 231 of memory cells coupled to the word lines 234-0 to 234-n. The select gates 232, 233 can subsequently be turned on whenever that threshold voltage is applied to a control gate of one or more of the transistors illustrated in FIG. 2.

Figure 3:
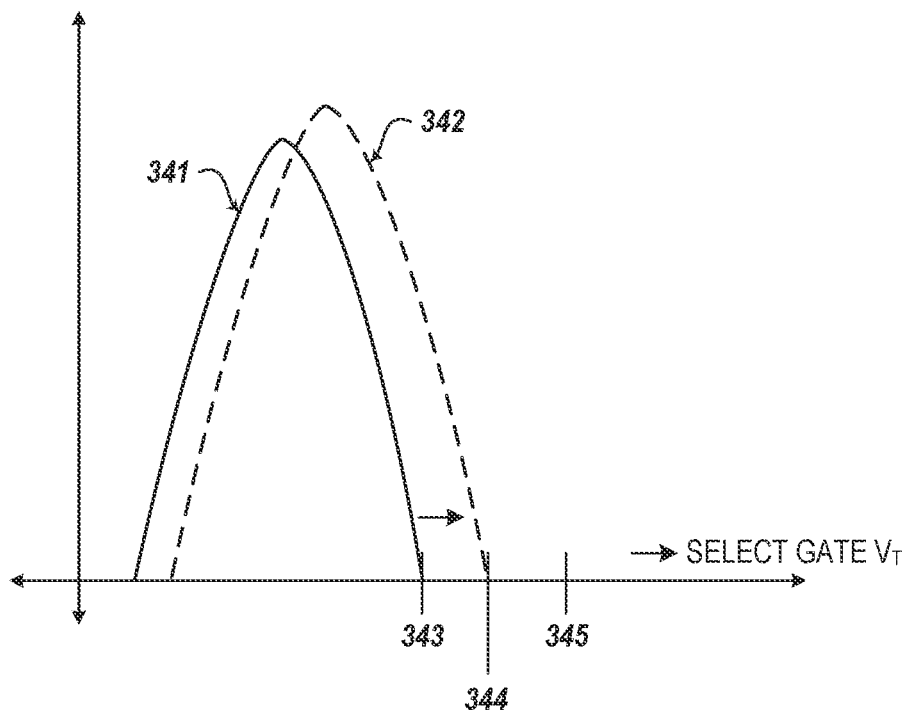
FIG. 3 illustrates an example of a threshold voltage (VT) distribution plot for a select gate in accordance with some embodiments of the present disclosure.

FIG. 3 illustrates an example of a threshold voltage (VT) distribution plot for a select gate in accordance with some embodiments of the present disclosure. As shown in FIG. 3, a select gate of a memory string (e.g., select gate 232 and/or select gate 233 of memory string 231, as shown in FIG. 2) can have a programmed threshold voltage within the programmed threshold voltage distribution 341. As mentioned, the programmed threshold voltage can be programmed to a particular threshold voltage prior to initial use of the memory device. The programmed threshold voltage can have different values for various applications.

Embodiments of the provide that select gates are assigned a select gate reliability rank, based upon threshold voltage values for the respective select gates of respective memory strings. These select gate reliability ranks can be utilized to determine which type of data are programmable to respective memory strings.

The select gates having a programmed threshold voltage can be assigned a programmed threshold voltage reliability rank. The select gates having the programmed threshold voltage reliability rank (i.e., the select gates having the programmed threshold voltage) are at a lowest state of physical degradation, as compared to other select gates that have increased and/or decreased threshold voltages due to program-erase cycled (PEC) and or sensing operations being performed by a memory string associated with the select gates. Because the select gates having the programmed threshold voltage reliability rank are at a lowest state of physical degradation (e.g., are the healthiest), hot data, warm data, cold memory data, or any combination thereof are programmable to memory strings including the select gates having the programmed threshold voltage.

Embodiments provide that data (e.g., memory objects) can be assigned respective designations. As used herein, "memory object" refers to data that can be written to and/or read from a memory device. Herein, data can have one of three or more designations. The first designation may be referred to as generally "hot" (e.g., hot memory object and/or hot data). The second designation may be referred to as generally "warm" (e.g., warm memory object and/or warm data). The third designation may be referred to as generally "cold" (e.g., cold memory object and/or cold data). Other designations may include combinations of the three enumerated designations, above.

"Cold data," as used herein, means that particular data or a particular memory object has not been accessed for a long duration relative to other data or memory objects read from a memory device. "Hot data," as used herein, means that particular data or a particular memory object has been accessed frequently relative to other data or memory objects read from a memory device. "Warm data," as used herein means that particular data or a particular memory object has been accessed at a greater frequency than "cold data" but at a lower frequency than "hot data." As mentioned above, intermediary "temperatures" of data are contemplated such that there can be designation that fall between the first, second, and/or third designations described herein.

As such, the first designation (hot designation) may be considered to be more hot than the second designation (warm designation), and both the first designation and the second designation may be considered to be more hot than the third designation (cold designation). Similarly, the third designation (cold) may be considered to be more cold than the second designation (warm) or the first designation (hot).

A number of parameters can be utilized in designating data as hot, warm, or cold. Embodiments provide that the number of parameters can be weighted differently for various applications.

Access frequency can be utilized in designating data as hot, warm, or cold. Access frequency indicates how often an associated address space is accessed during a particular time interval. Generally, a greater access frequency will make data more hot, as compared to other data having a lesser access frequency. In other words, data having the greatest access frequency will generally have a hot designation and data the least access frequency will generally have a cold designation; data having the warm designation will generally have a lesser access frequency as compared to data having the hot designation, while have a greater access frequency as compared to data having the cold designation.

The size of the data can be utilized in designating data as hot, warm, or cold. The size of the data can correspond to a quantity of bits or other information contained within the data. Generally, a smaller size will make a data more hot, as compared to other data having a greater size. In other words, data having the smallest size will generally have a hot designation and data having the largest size will generally have a cold designation; data having the warm designation will generally have a larger size as compared to data having the hot designation, while have a smaller size as compared to data having the cold designation.

An amount of large sequential write traffic versus an amount of small non-sequential write traffic can be utilized in designating data as hot, warm, or cold. Data that have a greater amount of small non-sequential write traffic will generally be more hot, as compared to other data that have a greater amount of large sequential write traffic (i.e., data that are sequentially or serially accessed). In other words, data that have greater amounts of small non-sequential write traffic will generally have the hot designation and data that have greater amounts of large sequential write traffic will generally have the cold designation, while data having the warm designation will have a lesser amount of small non-sequential write traffic than data having the hot designation.

A quantity of error corrections performed involving the data can be utilized in designating data as hot, warm, or cold. Generally, fewer error corrections during a time interval will make data more hot, as compared to other data having more error corrections during the time interval. Similarly, more error corrections during a time interval will make data more cold, as compared to other data having fewer error corrections during the time interval.

A quantity of read/write disturb operations involving memory cells in which the data is stored can be utilized in designating data as hot, warm, or cold. Generally, fewer read/write disturbs during a time interval will make data more hot, as compared to other data having more read/write disturbs during the time interval. Similarly, more read/write disturbs during a time interval will make data more cold, as compared to other data having fewer read/write disturbs during the time interval.

Embodiments provide that data may change designations over time. For instance, hot data may later become warm data that may later become cold data. Similarly, cold data may later become warm data that may later become hot data.

As mentioned, the threshold voltage distribution 341 of the select gates can shift or "drift," due to physical degradation. This physical degradation can occur due to operations involving quality characteristics being performed by a memory string including the select gates. For instance, as more operations involving quality characteristics being performed by a memory string including the select gates are performed, the physical degradation of the select gates increases. As used herein, "quality characteristics" generally refer to a quantity of program-erase cycles (PEC) and/or a quantity of sense operation performed involving memory cells and/or select gates of a memory string.

As used herein, the term "quality characteristics," and variants thereof, generally refer to quantifiable attributes of a memory die, and/or the constituent components thereof (e.g., select gates), that affect the performance of the memory die, and/or the constituent components, and, therefore, the memory device or memory sub-system in which the memory die is deployed. Non-limiting examples of quality characteristics can include a quantity of program-erase cycles (PEC) that memory cells of the memory die have undergone; operating temperatures that the memory die has been subjected to; physical age, (e.g., the number of months or years a device has been in the field, independent of PEC); workload, which can be measured by a quantity of read, write, and/or erase operations; disturb effects; charge loss, charge gain, and/or other voltage drift phenomenon experienced by programmable select gates of the memory die; and the presence of other errors in a memory device and/or memory sub-system.

A number of embodiments of the present disclosure provide that quality characteristics are based, at least in part on, a quantity of program-erase cycles (PEC) and/or a quantity of sense operations (e.g., read operations) performed by a memory string associated with the select gates. For example, a combination (e.g., a sum) of a quantity of program-erase cycles (PEC) and or a quantity of sense operations performed by a memory string associated with the select gates may be utilized for a quality characteristic count.

One or more embodiments provide that the quality characteristic count can be incremented (e.g., increased) from a starting value (e.g., zero) at each instance of a program-erase cycle (PEC) and/or a sense operation being performed by a memory string associated with the select gates. Embodiments provide that there can be a respective quality characteristic count for each respective memory string of a memory device.

One or more embodiments provide that the quality characteristic count can be incremented to a first check voltage value 343. The first check voltage value can have different values for various applications. When the quality characteristic count is equal to the first check voltage value 343, the threshold voltage of the select gates of the memory string can be determined.

When the threshold voltage of one or more of the select gates of the memory string is determined at the first check voltage value 343, and the determined threshold voltage of the select gate(s) is within a predetermined range of the programmed threshold voltage of the select gate(s) of the memory string, the select gate reliability rank of programmed threshold voltage reliability rank is maintained. The predetermined range can have different values for various applications. For instance, predetermined range can be ±5%, ±10%, or +15% from the programmed threshold voltage, among other values.

When the threshold voltage of one or more of the select gates of the memory string is determined at the first check voltage value 343, and the determined threshold voltage of the select gate(s) is within a predetermined range of the programmed threshold voltage of the select gate(s) of the memory string, the quality characteristic count can continue to be incremented from the first check voltage value 343 for a predetermined value, whereupon the threshold voltage of the select gates of the memory string can again be determined. The predetermined value can have different values for various applications. For instance, the predetermined value can be 5, 10, or 15 instances of a program-erase cycle (PEC) and/or a sense operation, among other values. This incrementing and again determining the threshold voltage of the select gate(s) may be repeated (while the programmed threshold voltage reliability rank is maintained) until the determined threshold voltage of the select gate(s) of the memory string is shifted beyond the predetermined range of the programmed threshold voltage.

When the threshold voltage of the select gates of the memory string is shifted (i.e., increased or decreased) beyond the predetermined range of the programmed threshold voltage, the select gate(s) can be assigned a first reliability rank. As shown in FIG. 3, a shifted threshold voltage distribution 342 has increased as compared to the threshold voltage distribution 341. The shifted threshold voltage distribution 342 indicates that physical degradation has occurred, as compared to a state of the select gates having the threshold voltage distribution 341 (e.g., the select gates having the shifted threshold voltage distribution 342 are less healthy (more degraded) than the select gates having the threshold voltage distribution 341). While FIG. 3 shows the shifted threshold voltage distribution 342 as increased as compared to the threshold voltage distribution 341, embodiments are not limited. For instance, a number of embodiments provide that the shifted threshold voltage distribution 342 can be decreased as compared to the threshold voltage distribution 341.

The first reliability rank indicates that warm data or cold data, or both, are programmable to the memory string. In contrast to the programmed threshold voltage reliability rank, hot data is not programmable to memory strings that that have at least one select gate having the first reliability rank.

One or more embodiments provide that the quality characteristic count can be incremented to a second check voltage value 344. The second check voltage value can have different values for various applications. When the quality characteristic count is equal to the second check voltage value 344, the threshold voltage of the select gates of the memory string can be determined.

When the threshold voltage of one or more of the select gates of the memory string is determined at the second check voltage value 344, and the determined threshold voltage of the select gate(s) is within a predetermined range of the threshold voltage of the select gate(s) associated with the first reliability rank, the select gate reliability rank of first reliability rank is maintained. The predetermined range can have different values for various applications. For instance, predetermined range can be ±5%, ±10%, or +15% from the first threshold voltage, among other values.

When the threshold voltage of one or more of the select gates of the memory string is determined at the second check voltage value 344, and the determined threshold voltage of the select gate(s) is within a predetermined range of the threshold voltage of the select gate(s) associated with the first reliability rank, the quality characteristic count can continue to be incremented from the second check voltage value 344 for a predetermined value, whereupon the threshold voltage of the select gates of the memory string can again be determined. The predetermined value can have different values for various applications. For instance, predetermined value can be 5, 10, or 15 instances of a program-erase cycle (PEC) and/or a sense operation, among other values. This incrementing and again determining the threshold voltage of the select gate(s) may be repeated (while the first reliability rank is maintained) until the determined threshold voltage of the select gate(s) of the memory string is shifted beyond a predetermined range of the threshold voltage of the select gate(s) associated with the first reliability rank.

When the threshold voltage of the select gates of the memory string is shifted (i.e., increased or decreased) beyond a predetermined range of the threshold voltage of the select gate(s) associated with the first reliability rank, the select gate(s) can be assigned a second reliability rank. This shifted threshold voltage indicates that physical degradation has occurred, as compared to a state of the select gates having the first reliability rank (e.g., the select gates having the shifted second reliability rank are less healthy (more degraded) than the select gates having first reliability rank). The shifted threshold voltage of select gates having the second reliability rank can be either increased or decreased as compared to select gates having the first reliability ranking.

The second reliability rank indicates that cold data is programmable to the memory string. In contrast to the first reliability ranking, warm data is not programmable to memory strings that that have at least one select gate having the second reliability rank.

One or more embodiments provide that the quality characteristic count can be incremented to a third check voltage value 345. The third check voltage value can have different values for various applications. When the quality characteristic count is equal to the third check voltage value 345, the threshold voltage of the select gates of the memory string can be determined.

When the threshold voltage of one or more of the select gates of the memory string is determined at the third check voltage value 345, and the determined threshold voltage of the select gate(s) is within a predetermined range of the threshold voltage of the select gate(s) associated with the second reliability rank, the select gate reliability rank of second reliability rank is maintained. The predetermined range can have different values for various applications. For instance, predetermined range can be ±5%, ±10%, or +15% from the second threshold voltage, among other values.

When the threshold voltage of one or more of the select gates of the memory string is determined at the third check voltage value 345, and the determined threshold voltage of the select gate(s) is within a predetermined range of the threshold voltage of the select gate(s) associated with the second reliability rank, the quality characteristic count can continue to be incremented from the third check voltage value 344 for a predetermined value, whereupon the threshold voltage of the select gates of the memory string can again be determined. The predetermined value can have different values for various applications. For instance, predetermined value can be 5, 10, or 15 instances of a program-erase cycle (PEC) and/or a sense operation, among other values. This incrementing and again determining the threshold voltage of the select gate(s) may be repeated (while the second reliability rank is maintained) until the determined threshold voltage of the select gate(s) of the memory string is shifted beyond a predetermined range of the threshold voltage of the select gate(s) associated with the second reliability rank.

When the threshold voltage of the select gates of the memory string is shifted (i.e., increased or decreased) beyond a predetermined range of the threshold voltage of the select gate(s) associated with the second reliability rank, the select gate(s) can be assigned a third reliability rank. This shifted threshold voltage indicates that physical degradation has occurred, as compared to a state of the select gates having the second reliability rank (e.g., the select gates having the shifted third reliability rank are less healthy (more degraded) than the select gates having second reliability rank). The shifted threshold voltage of select gates having the third reliability rank can be either increased or decreased as compared to select gates having the second reliability ranking.

The third reliability rank indicates that hot data, warm data, or cold data, or any combination thereof are not programmable to the memory string. The third reliability rank indicates memory strings that that have at least one select gate having the third reliability rank are nearing or at an end of useful life.

The select gates of a particular memory string can have a same select gate reliability ranking. For instance, the select gates of a particular memory string can have a both have a programmed reliability rank that indicates that hot data, warm data, and cold data, or any combination thereof are programmable to the memory string; the select gates of a particular memory string can have a both have a first reliability rank that indicates that warm data and cold data, or any combination thereof are programmable to the memory string; the select gates of a particular memory string can have a both have a second reliability rank that indicates that cold data is programmable to the memory string; or the select gates of a particular memory string can have a both have a third reliability rank that indicates that hot data, warm data, and the cold data, or any combination thereof are not programmable to the memory string.

However, embodiments are not so limited. For example, the select gates of a particular memory string can have different select gate reliability rankings. When the select gates of a particular memory string have different select gate reliability rankings, the ranking of the more deteriorated select gate is utilized to determine what type(s) of data, if any, are programmable to the memory string. For instance, a first select gate of a particular memory string can have a programmed reliability rank, while a second select gate of the particular memory string can have a first reliability rank; for this instance, warm data and cold data, or any combination thereof (corresponding to the first reliability rank) are programmable to the particular memory string, while hot data is not programmable to the particular memory string. Similarly, a first select gate of a particular memory string can have a first reliability rank, while a second select gate of the particular memory string can have a second reliability rank; for this instance, cold data (corresponding to the second reliability rank) is programmable to the particular memory string, while warm data is not programmable to the particular memory string. Also, a first select gate of a particular memory string can have a second reliability rank, while a second select gate of the particular memory string can have a third reliability rank; for this instance, hot data, warm data, and cold data, or any combination thereof are not programmable to the memory string (corresponding to the third reliability rank).

Figure 4:
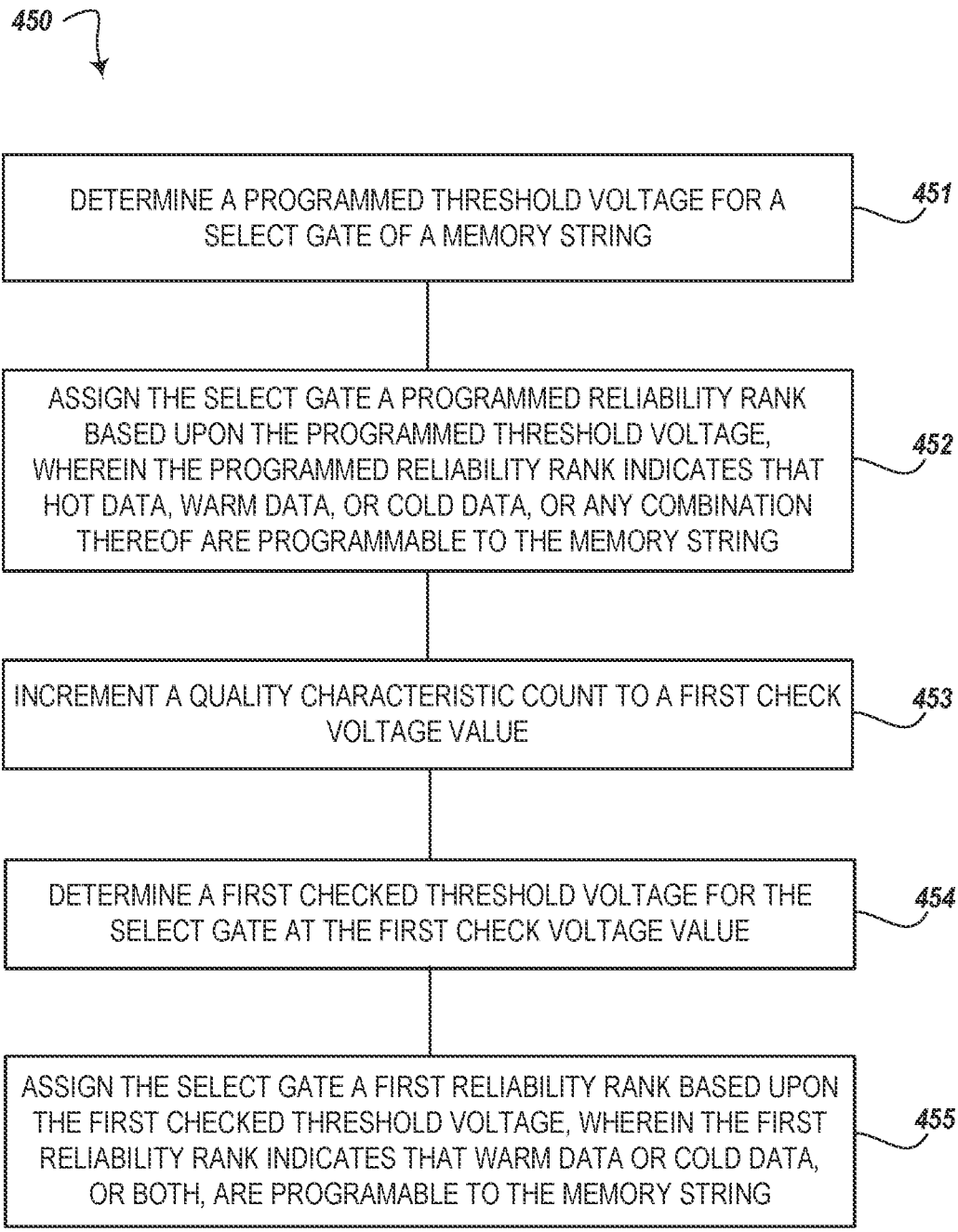
FIG. 4 is a flow diagram corresponding to a method for select gate reliability in accordance with some embodiments of the present disclosure.

FIG. 4 is a flow diagram corresponding to a method 450 for select gate reliability operations in accordance with some embodiments of the disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the select gate reliability component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 451, programmed threshold voltage for a select gate of a memory string can be determined. As an example, the each of the select gates of each memory string can be programmed to a respective particular programmed threshold voltage.

At operation 452, the select gate can be assigned a programmed reliability rank based upon the programmed threshold voltage, wherein the programmed reliability rank indicates that hot data, warm data, or cold data, or any combination thereof are programmable to the memory string.

At operation 453, a quality characteristic count can be incremented to a first check voltage value. As described above a quality characteristic can be based, at least in part on, a quantity of program-erase cycles (PEC) and/or a quantity of sense operations (e.g., read operations) performed by a memory string associated with the select gates. The quality characteristic count can correspond to a value indicative of an aggregate of one or more quality characteristics.

At operation 454, a first checked threshold voltage for the select gate at the first check voltage value can be determined. The first checked threshold voltage value can be analogous to the first check voltage value 343 illustrated in FIG. 3, herein.

At operation 455, a first reliability rank based upon the first checked threshold voltage, can be assigned to the select gate. The first reliability rank indicates that the warm data or the cold data, or both, are programmable to the memory string.

The method 450 can include one or more operations to increment the quality characteristic count to a second check voltage value. When the quality characteristic count reaches the second voltage value, a second checked threshold voltage can be determined for the select gate. The select gate can be assigned a second reliability rank based upon the second checked threshold voltage, wherein the second reliability rank indicates that the cold data is programmable to the memory string.

The method 450 can include one or more operations to increment the quality characteristic count to a third checked voltage value. When the quality characteristic count reaches the third voltage value, a third checked threshold voltage can be determined for the select gate. The select gate can be assigned a third reliability rank based upon the third checked threshold voltage, wherein the third reliability rank indicates that the hot data, the warm data, or the cold data, or any combination thereof are not programmable to the memory string.

Figure 5:
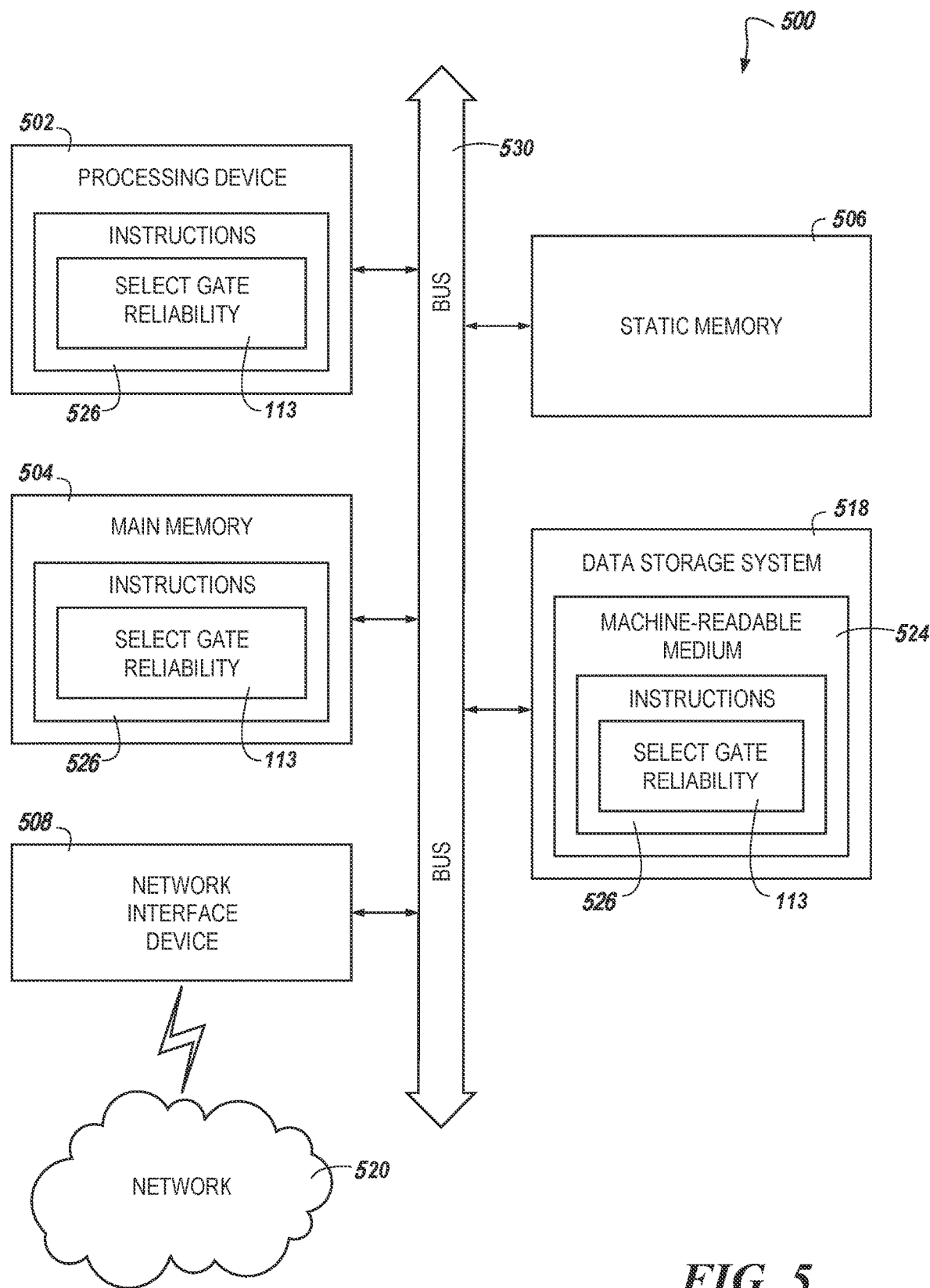
FIG. 5 is a block diagram of an example computer system in which embodiments of the present disclosure may operate.

FIG. 5 is a block diagram of an example computer system 500 in which embodiments of the present disclosure may operate. FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the select gate reliability component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a select gate reliability component (e.g., the select gate reliability component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining a programmed threshold voltage for a select gate of a memory string;
   assigning the select gate a programmed reliability rank based upon the programmed threshold voltage, wherein the programmed reliability rank indicates that hot data, warm data, or cold data, or any combination thereof are programmable to the memory string;
   incrementing a quality characteristic count to a first check voltage value;
   determining a first checked threshold voltage for the select gate at the first check voltage value; and
   assigning the select gate a first reliability rank based upon the first checked threshold voltage, wherein the first reliability rank indicates that the warm data or the cold data, or both, are programmable to the memory string.

2. The method of claim 1, further comprising:
   incrementing the quality characteristic count to a second check voltage value;
   determining a second checked threshold voltage for the select gate at the second checked voltage value; and
   assigning the select gate a second reliability rank based upon the second checked threshold voltage, wherein the second reliability rank indicates that the cold data is programmable to the memory string.

3. The method of claim 2, further comprising:
   incrementing the quality characteristic count to a third checked voltage value;
   determining a third checked threshold voltage for the select gate at the third checked voltage value; and
   assigning the select gate a third reliability rank based upon the third checked threshold voltage, wherein the third reliability rank indicates that the hot data, the warm data, or the cold data, or any combination thereof are not programmable to the memory string.

4. The method of claim 3, wherein the first checked threshold voltage is greater than the programmed threshold voltage, the second checked threshold voltage is greater than the first checked threshold voltage, and the third checked threshold voltage is greater than the second checked threshold voltage.

5. The method of claim 3, wherein the first checked threshold voltage is less than the programmed threshold voltage, the second checked threshold voltage is less than the first checked threshold voltage, and the third checked threshold voltage is less than the second checked threshold voltage.

6. The method of claim 1, wherein the quality characteristic count is based, at least in part, on a quantity of program-erase cycles (PEC) and a quantity of sense operations performed by the memory string.

7. The method of claim 1, wherein the select gate is programmable.

8. An apparatus, comprising:
   a block of memory cells comprising a plurality of memory strings; and
   a memory sub-system reliability component coupled to the block of memory cells, wherein the memory sub-system reliability component is to:
      assign a first select gate and a second select gate of a memory string of the plurality of memory strings a respective first select gate programmed reliability rank and a second select gate programmed reliability rank based upon respective programmed threshold voltages for the first select gate and the second select gate, wherein the programmed reliability ranks indicate that hot data, warm data, or cold data, or any combination thereof are programmable to the memory string;
      increment a quality characteristic count for the first select gate and the second select gate to a first check voltage value;
      determine a first select gate first checked threshold voltage and a second select gate first checked threshold voltage at the first check voltage value;
      compare the first select gate first checked threshold voltage and the second select gate first checked threshold voltage to determine that the first select gate and the second select gate have a common first checked threshold voltage reliability; and
      assign the first select gate and the second select gate a first reliability rank based upon the first checked threshold voltage, wherein the first reliability rank indicates that the warm data or the cold data, or both, are programmable to the memory string.

9. The apparatus of claim 8, wherein the first reliability rank indicates that the first select gate and the second select gate of the memory string have degraded as compared to the first select gate and the second select gate having the respective first select gate programmed reliability rank and the second select gate programmed reliability rank.

10. The apparatus of claim 8, wherein the memory sub-system reliability component is to
    increment the quality characteristic count for the first select gate and the second select gate to a second check voltage value;
    determine a first select gate second checked threshold voltage and a second select gate second checked threshold voltage at the second checked voltage value;
    compare the first select gate second checked threshold voltage and the second select gate second checked threshold voltage to determine that the first select gate and the second select gate have a common second checked threshold voltage reliability; and
    assign the first select gate and the second select gate a second reliability rank based upon the second checked threshold voltage, wherein the second reliability rank indicates that the cold data is programmable to the memory string.

11. The apparatus of claim 10, wherein the second reliability rank indicates that the first select gate and the second select gate of the memory string have degraded as compared to the first select gate and the second select gate having the first reliability rank.

12. The apparatus of claim 10, wherein the memory sub-system reliability component is to
    increment the quality characteristic count for the first select gate and the second select gate to a third checked voltage value;

determine a first select gate third checked threshold voltage and a second select gate third checked threshold voltage at the third checked voltage value;

compare the first select gate third checked threshold voltage and the second select gate third checked threshold voltage to determine that the first select gate and the second select gate have a common third checked threshold voltage reliability; and assign the first select gate and the second select gate a third reliability rank based upon the third checked threshold voltage, wherein the third reliability rank indicates that that the hot data, the warm data, or the cold data, or any combination thereof are not programmable to the memory string.

13. The apparatus of claim 12, wherein the third reliability rank indicates that the first select gate and the second select gate of the memory string have degraded as compared to the first select gate and the second select gate having the second reliability rank.

14. The apparatus of claim 8, wherein the first select gate and the second select gate are connected in series.

15. The apparatus of claim 8, wherein the quality characteristic count is based, at least in part, on a combination of a quantity of program-erase cycles (PEC) and a quantity of sense operation performed by the memory string.

16. A system, comprising:
a block of memory cells comprising a plurality of memory strings; and
a processor coupled to the block of memory cells, wherein the processor is to:
assign a first select gate and a second select gate of a memory string of the plurality of memory strings a respective first select gate programmed reliability rank a second select gate programmed reliability rank based upon respective programmed threshold voltages for the first select gate and the second select gate, wherein the programmed reliability ranks indicate that hot data, warm data, or cold data, or any combination thereof are programmable to the memory string;
increment a quality characteristic count for the first select gate and the second select gate to a first check voltage value;
determine a first select gate first checked threshold voltage and a second select gate first checked threshold voltage at the first check voltage value;
compare the first select gate first checked threshold voltage and the second select gate first checked threshold voltage to determine that the first select gate and the second select gate have a do not have common first checked threshold voltage reliability; and assign either the first select gate or the second select gate a first reliability rank based upon a lower first checked threshold voltage reliability, wherein the first reliability rank indicates that the warm data or the cold data, or both, are programmable to the memory string.

17. The system of claim 16, wherein the processor is to increment the quality characteristic count for the first select gate and the second select gate to a second check voltage value;

determine a first select gate second checked threshold voltage and a second select gate second checked threshold voltage at the second checked voltage value;

compare the first select gate second checked threshold voltage and the second select gate second checked threshold voltage to determine that the first select gate and the second select gate do not have a common second checked threshold voltage reliability; and assign either the first select gate or the second select gate a second reliability rank based upon a lower second checked threshold voltage reliability, wherein the second reliability rank indicates that the cold data is programmable to the memory string.

18. The system of claim 17, wherein the processor is to increment the quality characteristic count for the first select gate and the second select gate to a third checked voltage value;

determine a first select gate third checked threshold voltage and a second select gate third checked threshold voltage at the third checked voltage value;

compare the first select gate third checked threshold voltage and the second select gate third checked threshold voltage to determine that the first select gate and the second select gate do not have a common third checked threshold voltage reliability; and assign either the first select gate or the second select gate a third reliability rank based upon a lower third checked threshold voltage reliability, wherein the third reliability rank indicates that that the hot data, the warm data, or the cold data, or any combination thereof are not programmable to the memory string.

19. The system of claim 16, wherein the first select gate and the second select gate of the memory string are connected in series.

20. The system of claim 16, wherein the processor is to assign either the first select gate or the second select gate of another memory string a first reliability rank based upon a lower first checked threshold voltage reliability for the first select gate or the second select gate of the another memory string, wherein the first reliability rank indicates that the warm data or the cold data, or both, are programmable to the another memory string.

* * * * *